(12) United States Patent
Chang et al.

(10) Patent No.: US 8,644,081 B2
(45) Date of Patent: Feb. 4, 2014

(54) FLASH MEMORY DEVICE AND PROGRAMMING METHOD THEREOF

(75) Inventors: Hsing-Wen Chang, Hsinchu (TW);
Yao-Wen Chang, Hsinchu (TW);
Chu-Yung Liu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 285 days.

(21) Appl. No.: 13/069,778

(22) Filed: Mar. 23, 2011

(65) Prior Publication Data

US 2012/0243334 A1 Sep. 27, 2012

(51) Int. Cl.
*G11C 16/04* (2006.01)
(52) U.S. Cl.
USPC ............. 365/185.28; 365/185.11; 365/185.17
(58) Field of Classification Search
USPC ................. 365/185.11, 185.17, 185.28
See application file for complete search history.

(56) References Cited

U.S. PATENT DOCUMENTS

| | | | | |
|---|---|---|---|---|
| 2009/0016111 A1* | 1/2009 | Kim et al. | ................ | 365/185.17 |
| 2011/0292734 A1* | 12/2011 | Kim | ........................ | 365/185.19 |

* cited by examiner

*Primary Examiner* — Hoai V Ho
(74) *Attorney, Agent, or Firm* — J.C. Patents (57) ABSTRACT

A flash memory device including a memory array, a row decoder and M page buffers is provided, wherein M is a positive integer. The memory array includes a plurality of memory cells and is electrically connected to a plurality of word lines and a plurality of bit lines. The row decoder drives a specific word line among the word lines during an enabling period. The M page buffers divide the enabling period into N sub-periods, wherein N is an integer greater than 2. Furthermore, the $i^{th}$, $(i+N)^{th}$, $(i+2N)^{th}$, ..., $(i+(M-1)*N)^{th}$ bit lines are driven by the M page buffers during the $i^{th}$ sub-period, so as to program the memory cells electrically connected to the specific word line, wherein i is an integer and $1 \le i \le N$.

8 Claims, 7 Drawing Sheets

FLASH MEMORY DEVICE AND PROGRAMMING METHOD THEREOF

BACKGROUND

1. Field of the Invention

The invention relates to a flash memory device and a programming method thereof. Particularly, the invention relates to a NAND flash memory device and a programming method thereof.

2. Description of Related Art

Figure 1:
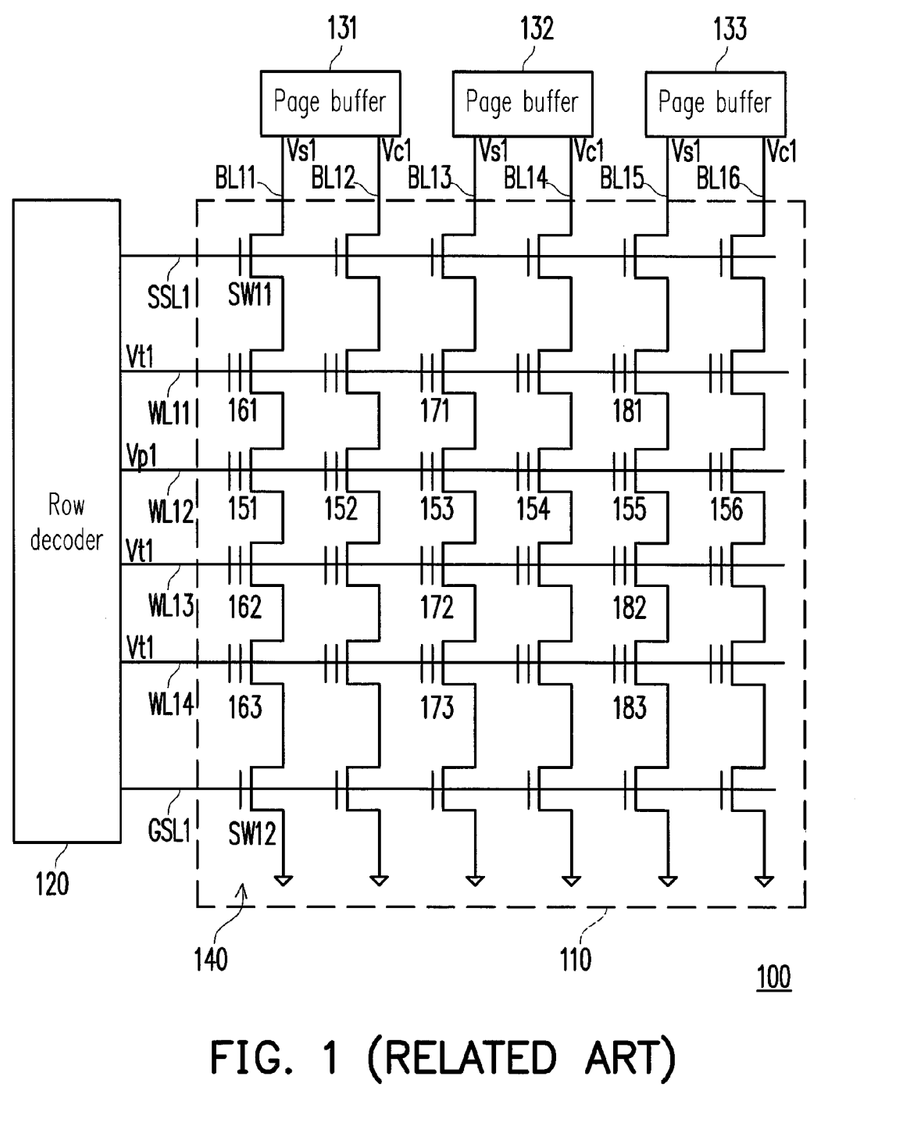
FIG. 1 is a block diagram of a typical NAND flash memory device.

FIG. 1 is a block diagram of a typical NAND flash memory device. Referring to FIG. 1, the NAND flash memory device 100 includes a memory cell array 110, a row decoder 120 and page buffers 131-133. The memory cell array 110 includes a plurality of memory cell strings, and each of the memory cell strings includes a selection transistor, a plurality of memory cells and a ground transistor connected in series. For example, a memory cell string 140 includes a selection transistor SW11, a plurality of memory cells 151, 161-163 and a ground transistor SW12 connected in series.

Moreover, the row decoder 120 is electrically connected to the memory cell array 110 through a string selection line SSL1, word lines WL11-WL14, and a ground selection line GSL1. The page buffers 131-133 are electrically connected to the memory cell array 110 through bit lines BL11-BL16. During a programming process, the row decoder 120 selects one of the word lines according to address data. Moreover, each of the page buffers is electronically connected to two bit lines, and alternately provides a ground voltage Vs1 and a power voltage Vc1 to the two bit lines. Moreover, when the bit line WL12 is selected, the row decoder 120 provides a programming voltage Vp1 to the selected word line WL12, and provides a pass voltage Vt1 to the unselected word lines WL11 and WL13-WL14.

In this way, as shown in FIG. 1, during a front half period of the programming operation, the page buffers 131-133 provide the ground voltage Vs1 to the odd bit lines BL11, BL13 and BL15, and provide the power voltage Vc1 to the even bit lines BL12, BL14 and BL16. Then, the odd memory cells 151, 153 and 155 connected to the word line WL12 are programmed. In order to avoid influencing the memory cells 152, 154 and 156 located on the same word line WL12, a channel voltage of each of the memory cell strings can be boosted to avoid variations of threshold voltages of the memory cells 152, 154 and 156, which is the so-called program disturbance.

Generally, according to an existing memory operating method, the channel voltage of each of the memory cell strings is boosted by increasing the pass voltage Vt1 provided by the row decoder 120, so as to reduce the program disturbance. However, if the pass voltage Vt1 provided by the row decoder 120 is excessively high, the threshold voltages of the memory cells 161-163, 171-173 and 181-183 respectively located on the same bit line with the memory cells 151, 153 and 155 are influenced, which is the so-called pass disturbance. In other words, although the existing memory operating method resolves the problem of program disturbance by increasing the pass voltage, the pass disturbance is increased. Therefore, how to reduce the program disturbance in consideration of the pass disturbance is an important issue to be developed in memory operation.

SUMMARY OF THE INVENTION

The invention is directed to a flash memory device, in which page buffers divide an enabling period into three or more than three sub-periods, and drive different bit lines during different sub-periods. In this way, program disturbance of memory cells can be reduced without increasing a pass voltage.

The invention is directed to a programming method of a flash memory device, by which an enabling period is divided into N sub-periods, and different bit lines are driven during different sub-periods. In this way, a channel voltage can be increased by reducing an equivalent total capacitance of memory cells.

The invention is directed to a flash memory device, in which each page buffer is electrically connected to three or more than three bit lines, respectively, and each page buffer drives the connected bit lines one-by-one during an enabling period. In this way, program disturbance of memory cells can be reduced without increasing a pass voltage.

The invention is directed to a programming method of a flash memory device, by which each page buffer is electrically connected to three or more than three bit lines, respectively, and each page buffer drives the connected bit lines one-by-one. In this way, a channel voltage can be increased by reducing an equivalent total capacitance of memory cells.

The invention provides a flash memory device including a memory cell array, a row decoder and M page buffers, wherein M is a positive integer. The memory cell array includes a plurality of memory cells and is electrically connected to a plurality of word lines and a plurality of bit lines. The row decoder drives a specific word line among the word lines during an enabling period. The M page buffers divide the enabling period into N sub-periods, wherein N is an integer greater than 2. Furthermore, the M page buffers drive an $i^{th}$, $(i+N)^{th}$, $(i+2N)^{th}$, ..., $(i+(M-1)*N)^{th}$ bit lines during an $i^{th}$ sub-period, so as to program the memory cells electrically connected to the specific word line, wherein i is an integer and $1 \leq i \leq N$.

In an embodiment of the invention, the memory cell array is further electrically connected to a string selection line and a ground selection line, and the row decoder respectively provides a power voltage and a ground voltage to the string selection line and the ground selection line during the enabling period, provides a program voltage to the specific word line, and provides a pass voltage to the other word lines.

In an embodiment of the invention, the M page buffers respectively provide a ground voltage to the $i^{th}$, $(i+N)^{th}$, $(i+2N)^{th}$, ..., $(i+(M-1)*N)^{th}$ bit lines during the $i^{th}$ sub-period, and respectively provide a power voltage to the other bit lines.

The invention provides a programming method of a flash memory device, wherein the flash memory device includes a memory cell array electrically connected to a plurality of word lines and a plurality of bit lines, and the memory cell array includes a plurality of memory cells. The programming method of the flash memory device includes following steps. A specific word line among the word lines is driven during an enabling period. The enabling period is divided into N sub-periods by M page buffers, wherein M is a positive integer, and N is an integer greater than 2. Furthermore, an $i^{th}$, $(i+N)^{th}$, $(i+2N)^{th}$, ..., $(i+(M-1)*N)^{th}$ bit lines are driven during an $i^{th}$ sub-period, so as to program the memory cells electrically connected to the specific word line, wherein i is an integer and $1 \leq i \leq N$.

The invention provides a flash memory device including a memory cell array, a row decoder and M page buffers, wherein M is a positive integer. The memory cell array includes a plurality of memory cells and is electrically connected to a plurality of word lines and a plurality of bit lines. The row decoder drives a specific word line among the word lines during an enabling period. Each of the page buffers is electrically connected to N bit lines of the bit lines, wherein N is an integer greater than 2. Furthermore, a $j^{th}$ page buffer drives an $(N*(j-1)+1)^{th}$ bit line to an $(N*j)^{th}$ bit line during the enabling period, so as to program the memory cells electrically connected to the specific word line one-by-one, wherein j is an integer and $1 \leq j \leq M$.

The invention provides a programming method of a flash memory device, wherein the flash memory device includes a memory cell array electrically connected to a plurality of word lines and a plurality of bit lines, and the memory cell array includes a plurality of memory cells. The programming method of the flash memory device includes following steps. A specific word line among the word lines is driven during an enabling period. M page buffers are electrically connected to the bit lines, and each of the page buffers is electrically connected to N bit lines of the bit lines, wherein M is a positive integer, and N is an integer greater than 2. A $j^{th}$ page buffer drives an $(N*(j-1)+1)^{th}$ bit line to an $(N*j)^{th}$ bit line during the enabling period, so as to program the memory cells electrically connected to the specific word line one-by-one, wherein j is an integer and $1 \leq j \leq M$.

According to the above descriptions, each of the page buffers is electrically connected to three or more than three bit lines, and each of the page buffers drives the electrically connected bit lines one-by-one during the enabling period. Moreover, according to another aspect, the enabling period is divided into N sub-periods, and different bit lines are driven during different sub-periods. In this way, an equivalent total capacitance of the memory cell strings can be reduced, so as to increase a channel voltage of each of the memory cell strings. Moreover, during the process of increasing the channel voltage, a level of the pass voltage is not increased, so that the pass disturbance is not increased. In other words, according to the invention, the program disturbance of the memory cell is reduced while considering not to increase the pass disturbance.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 2:
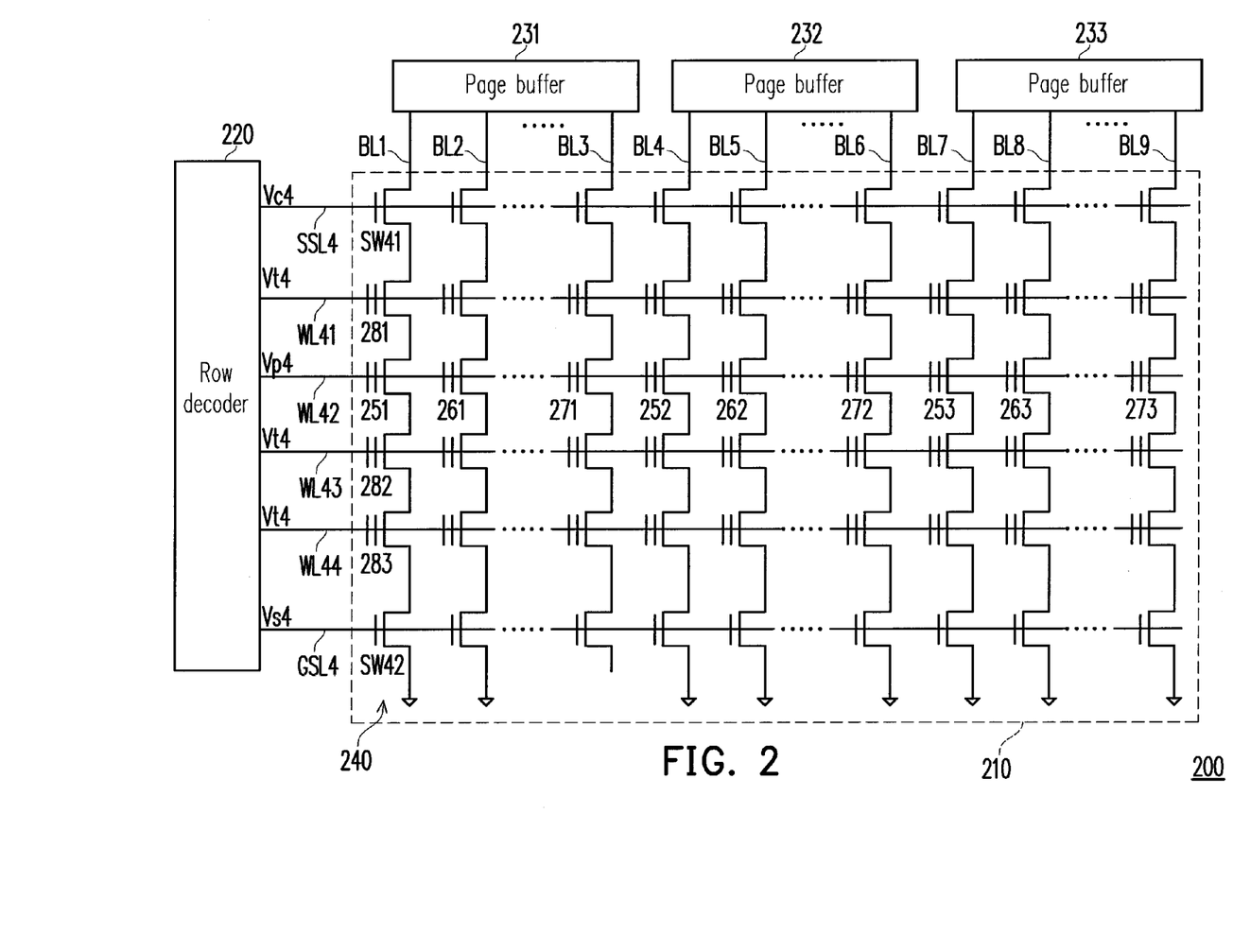
FIG. 2 is a schematic diagram of a flash memory device according to an embodiment of the invention.

FIG. 2 is a schematic diagram of a flash memory device according to an embodiment of the invention. Referring to FIG. 2, the flash memory device 200 includes a memory cell array 210, a row decoder 220 and M page buffers. In the embodiment of FIG. 2, three page buffers 231-233 (M=3) are taken as an example for descriptions, though the invention is not limited thereto.

In the present embodiment, the memory cell array 210 is an NAND memory cell array, so that the memory cell array 210 includes a plurality of memory cell strings, and each memory cell string includes a selection transistor, a plurality of memory cells and a ground transistor connected in series. For example, a memory cell string 240 includes a selection transistor SW41, a plurality of memory cells 251, 281-283 and a ground transistor SW42 connected in series. Moreover, the memory cell array 210 is electrically connected to a string selection line SSL4, word lines WL41-WL44, a ground selection line GSL4 and bit lines BL1-BL9.

The row decoder 220 is electrically connected to each of the selection transistors, for example, the selection transistor SW41 in the memory cell array 210 through the string selection line SSL4. Moreover, the row decoder 220 is electrically connected to each of the ground transistors, for example, the ground transistor SW42 in the memory cell array 210 through the ground selection line GSL4. Moreover, the row decoder 220 is electrically connected to the memory cells in the memory cell array 210 through the word lines WL41-WL44, for example, the memory cells 251, 281-283. During a programming operation, the row decoder 220 selects one of the word lines according to address data, and drives the selected word line during an enabling period.

The page buffers 231-233 are electrically connected to N bit lines, respectively, where N is an integer greater than 2. For example, if N is equal to 3, the $1^{st}$ page buffer 231 is electrically connected to a $1^{st}$ to a $3^{rd}$ bit lines BL1-BL3, the $2^{nd}$ page buffer 232 is electrically connected to a $4^{th}$ to a $6^{th}$ bit lines BL4-BL6, and the $3^{rd}$ page buffer 233 is electrically connected to a $7^{th}$ to a $9^{th}$ bit line BL7-BL9. Namely, a $j^{th}$ page buffer is electrically connected to an $((j-1)*N+1)^{th}$ bit line to an $(j*N)^{th}$ bit line, where j is an integer and $1 \leq j \leq M$. During the enabling period, each of the page buffers 231-233 sequentially drive the N bit lines, so as to program the memory cells electrically connected to a certain word line one-by-one.

Figure 3:
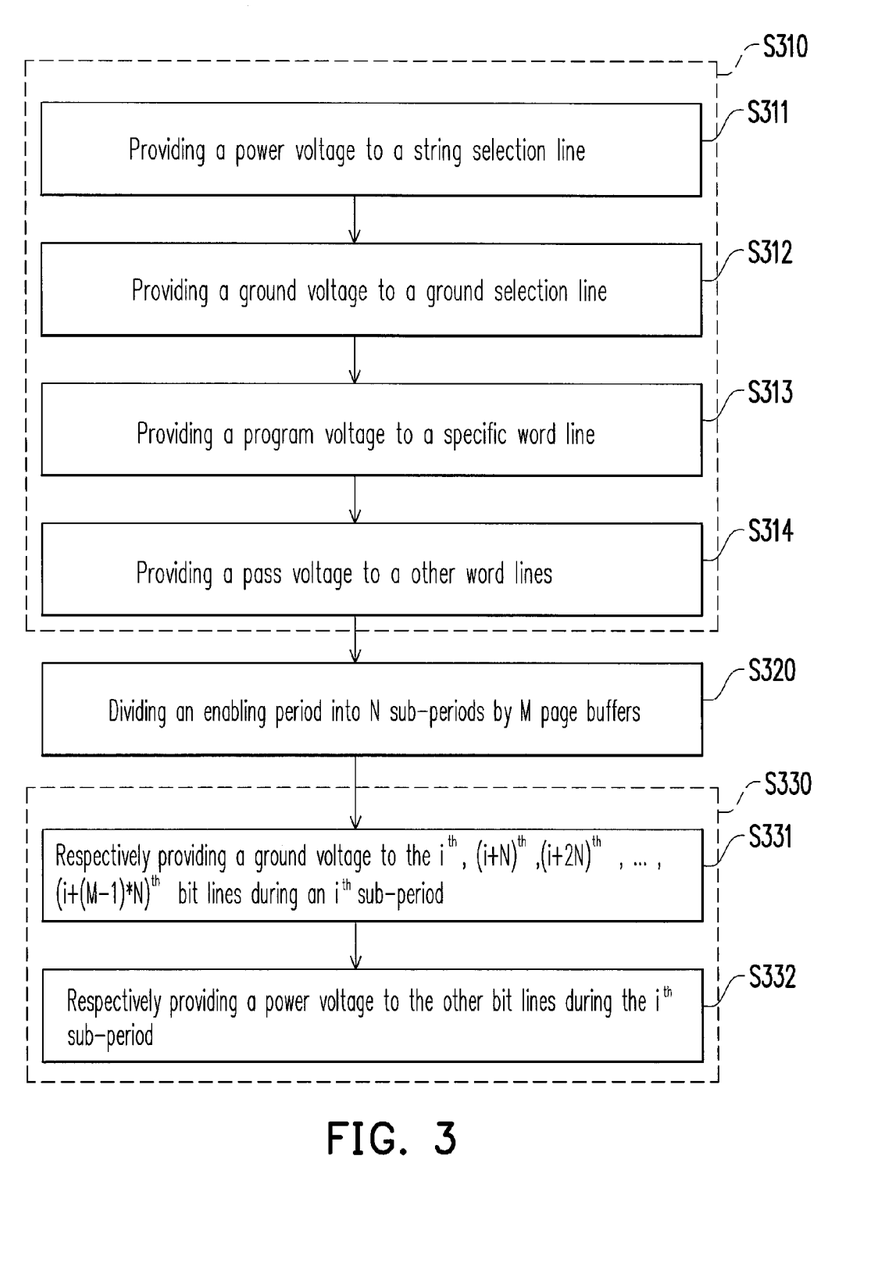
FIG. 3 is a flowchart illustrating a programming method of a flash memory device according to an embodiment of the invention.

In order to fully convey the spirit of the invention to those skilled in the art, a programming method of the flash memory device is provided below. FIG. 3 is a flowchart illustrating a programming method of a flash memory device according to an embodiment of the invention. Referring to FIG. 2 and FIG. 3 for detailed operations of the flash memory device 200.

During a process of programming the memory cell array 210, in step S310, the row decoder 220 drives a specific word line among the word lines during an enabling period. For example, if the row decoder 220 regards the word line WL42 as the specific word line, detailed steps of driving the specific word line WL42 is as follows. In step S311, the row decoder 220 provides a power voltage Vc4 to the string selection line SSL4 to turn on each of the selection transistors in the memory cell array 210. Moreover, in step S312, the row decoder 220 provides a ground voltage Vs4 to the ground selection line GSL4 to turn off each of the ground transistors in the memory cell array 210. In this way, one end of each memory cell string is electrically connected to the corresponding page buffer, and another end of each memory cell string is floating.

Moreover, in steps S313 and S314, the row decoder 220 provides a program voltage Vp4 to the specific word line WL42, and provides a pass voltage Vt4 to the other word lines WL41 and WL43-WL44. In this way, the memory cells 251-253, 261-263 and 271-273 electrically connected to the specific word line WL42 can be programmed according to signals transmitted by the page buffers 231-233. On the other hand, in step S320, the page buffers 231-233 divide the enabling period into N sub-periods, for example, if the page buffers 231-233 are respectively connected to three bit lines (N=3), the page buffers 231-233 may divide the enabling period into three sub-periods.

Moreover, in step S330, during an $i^{th}$ sub-period, the page buffers 231-233 drive the $i^{th}$, $(i+N)^{th}$, $(i+2N)^{th}$, ..., $(i+(M-1)*N)^{th}$ bit lines, so as to program the memory cells electrically connected to the specific word line, wherein i is an integer and $1 \le i \le N$. For example, if the three page buffers 231-233 divide the enabling period into three sub-periods, i.e. M=3 and N=3, a detailed flow of the step S330 is as follows.

As shown in FIG. 2, during the $1^{st}$ sub-period, the page buffers 231-233 respectively provide a ground voltage Vs4 to the $1^{st}$, $4^{th}$ and $7^{th}$ bit lines BL1, BL4 and BL7, and respectively provide a power voltage Vc4 to the other bit lines BL2-BL3, BL5-BL6 and BL8-BL9. Therefore, the memory cells 251-253 can be programmed. Then, during the $2^{nd}$ sub-period, the page buffers 231-233 respectively provide the ground voltage Vs4 to the $2^{nd}$, $5^{th}$ and $8^{th}$ bit lines BL2, BL5 and BL8, and respectively provide the power voltage Vc4 to the other bit lines BL1, BL3-BL4, BL6-BL7 and BL9. Therefore, the memory cells 261-263 can be programmed.

Finally, during the $3^{rd}$ sub-period, the page buffers 231-233 respectively provide the ground voltage Vs4 to the $3^{rd}$, $6^{th}$ and $9^{th}$ bit lines BL3, BL6 and BL9, and respectively provide the power voltage Vc4 to the other bit lines BL1-BL2, BL4-BL5 and BL7-BL. Therefore, the memory cells 271-273 can be programmed. In other words, in steps S331 and S332, during the $i^{th}$ sub-period, the page buffers 231-233 respectively provide the ground voltage Vs4 to the $i^{th}$, $(i+N)^{th}$, $(i+2N)^{th}$, ..., $(i+(M-1)*N)^{th}$ bit lines, and provides the power voltage Vc4 to the other bit lines.

In this way, during the process of programming the memory cells, regarding a bit line biased at the power voltage Vc4, at most one of the two left and right adjacent bit lines thereof is biased under the ground voltage Vs4. For example, during the $1^{st}$ sub-period, regarding the bit line BL5 biased at the power voltage Vc4, only the bit line BL4 at the left side thereof is biased under the ground voltage Vs4. Moreover, during the $1^{st}$ sub-period, regarding the bit line BL6 biased at the power voltage Vc4, only the bit line BL7 at the right side thereof is biased under the ground voltage Vs4. In this way, a channel voltage of each memory cell string can be increased, so as to reduce the pass disturbance of the memory cell.

Figure 4:
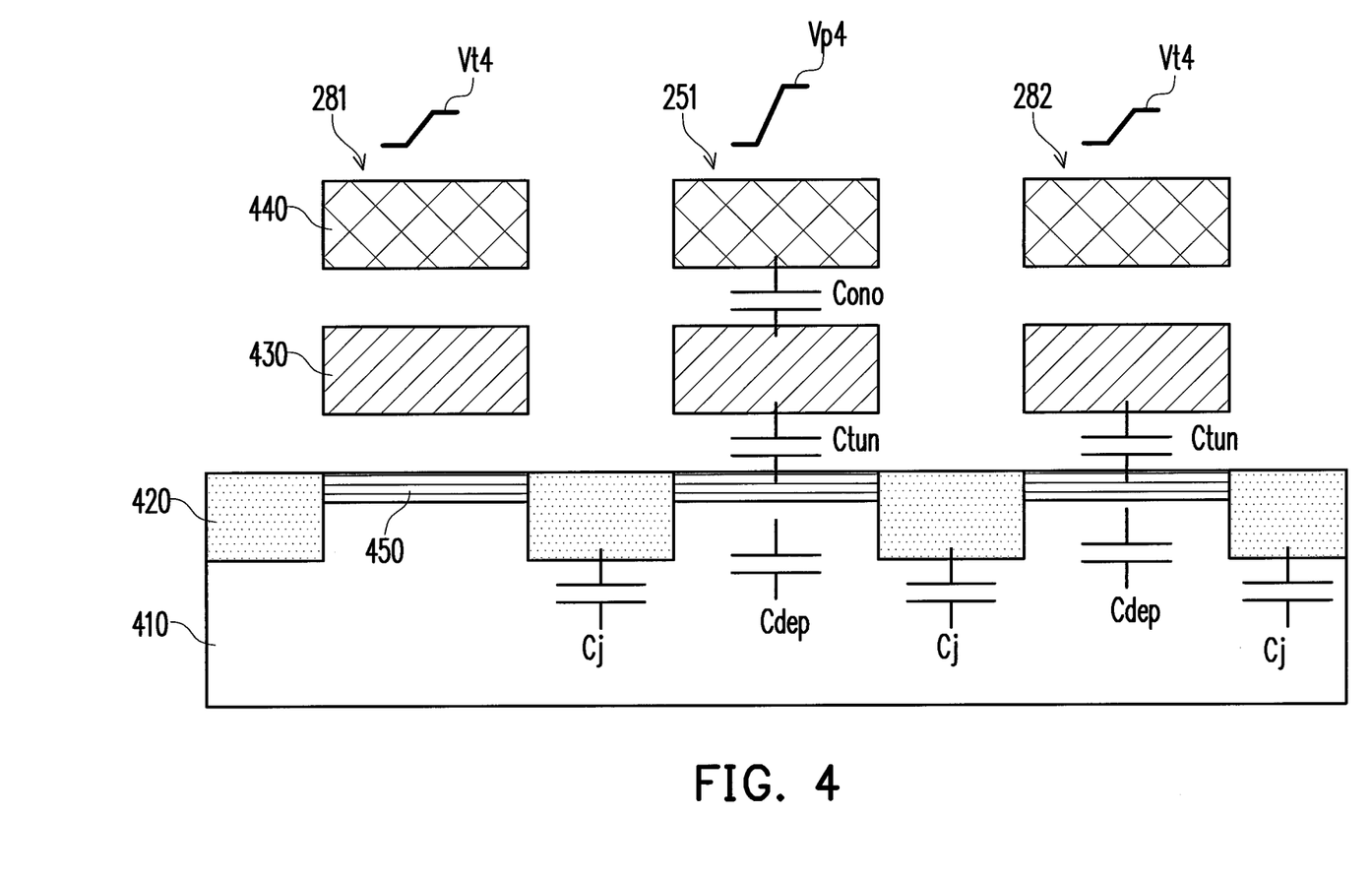
FIG. 4 is a cross-sectional view of a layout structure of memory cells according to an embodiment of the invention.

A main reason thereof lies in a layout structure of the memory cells shown in FIG. 4. FIG. 4 is a cross-sectional view of a layout structure of the memory cells 281, 251 and 282, in which a substrate 410, a source/drain doped layer 420, a floating gate layer 430 and a control gate layer 440 are illustrated. As shown in FIG. 4, control gates of the memory cells 281, 251 and 282 are respectively biased at the pass voltage Vt4, the program voltage Vp4 and the pass voltage Vt4, and the memory cells 281, 251 and 282 respectively form an inversion layer 450. Moreover, parasitic capacitances formed due to the layout structure include a parasitic capacitance Cono between the control gate and the floating gate, a parasitic capacitance Ctun between the floating gate and the inversion layer, a parasitic capacitance Cdep between the inversion layer and the substrate, and a junction capacitance Cj. Therefore, a channel voltage Vch of the memory cell string 240 is shown as a following equation (1):

$$Vch = \frac{(n-1) \cdot Cs \cdot (Vt4 - Vth - Vchi)}{n \cdot Ctotal} +$$
$$\frac{Cs \cdot (Vp4 - Vth - Vchi)}{n \cdot Ctotal} + Vchi$$
$$= \frac{(n-1) \cdot Cs}{n \cdot Ctotal} \cdot Vt4 + \frac{Cs}{n \cdot Ctotal} \cdot Vp4 - \frac{Cs}{Ctotal} \cdot Vt +$$
$$\left(1 - \frac{Cs}{Ctotal}\right) \cdot Vchi$$

$$Cs = \frac{Cono \cdot Ctun}{Ctun + Cono}, \; Cch = Cj + Cdep, \; Ctotal = Cs + Cch$$

equation (1)

Where, n is a number of the memory cells serially connected in the memory cell string 240, Vchi is an initial level of the channel voltage Vch when the memory cell string 240 is switched to a floating state, and Vth is a threshold voltage of the memory cell. As shown in the equation (1), the channel voltage Vch is inversely proportional to an equivalent total capacitance Ctotal. In other words, the channel voltage Vch can be increased by reducing the equivalent total capacitance Ctotal.

Figure 5:
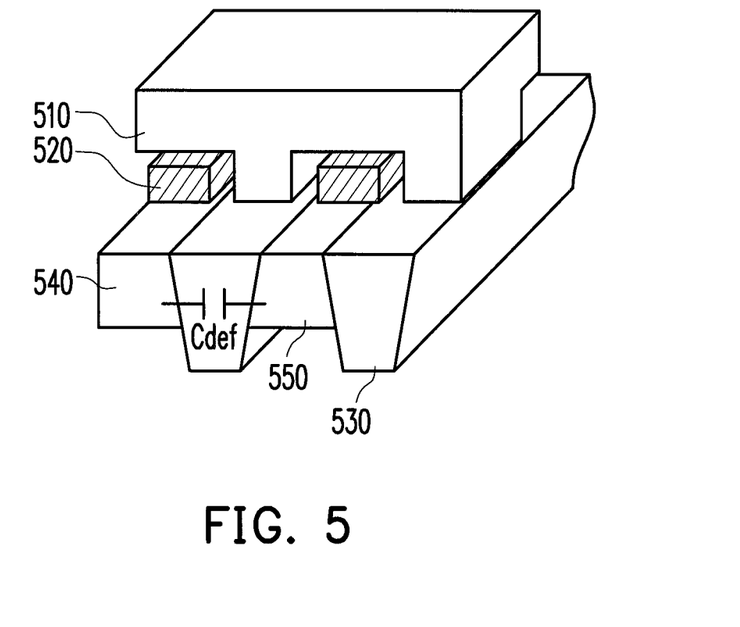
FIG. 5 is a cross-sectional view of another layout structure of memory cells according to an embodiment of the invention.

Moreover, FIG. 5 is a cross-sectional view of another layout structure of the memory cells according to an embodiment of the invention, in which the layout structure of the memory cells 251 and 261 are illustrated, and a control gate layer 510, a floating gate layer 520, an insulating layer 530 and diffusion bit lines 540 and 550 are indicated. As shown in FIG. 5, a parasitic diffusion capacitance Cdef can be formed between the two diffusion bit lines 540 and 550, and the diffusion capacitance Cdef is a part of the equivalent total capacitance Ctotal. Moreover, in view of an integrated circuit layout, the two diffusion bit lines 540 and 550 are electrically connected to the bit lines BL1 and BL2, respectively. In other words, voltage levels of the bit lines BL1 and BL2 determine whether the diffusion capacitance Cdef is formed, and accordingly influence a magnitude of the equivalent total capacitance Ctotal.

Figure 6A:
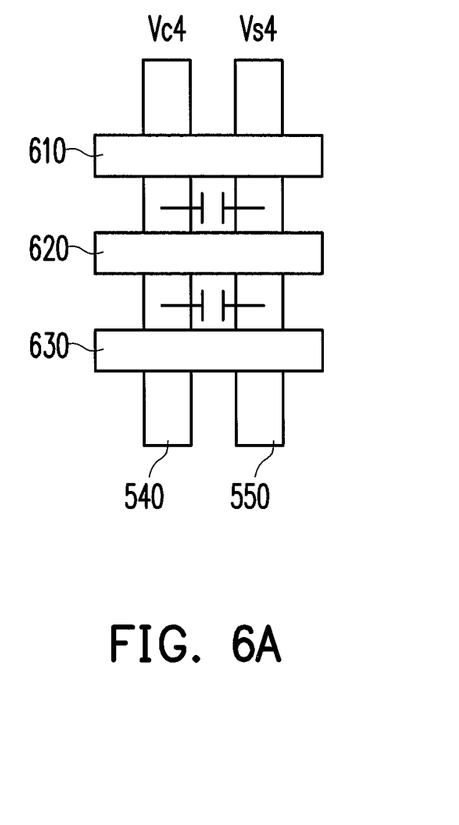
FIG. 6A and FIG. 6B are layout schematic diagrams of diffusion bit lines and diffusion word lines according to an embodiment of the invention.
Figure 6B:
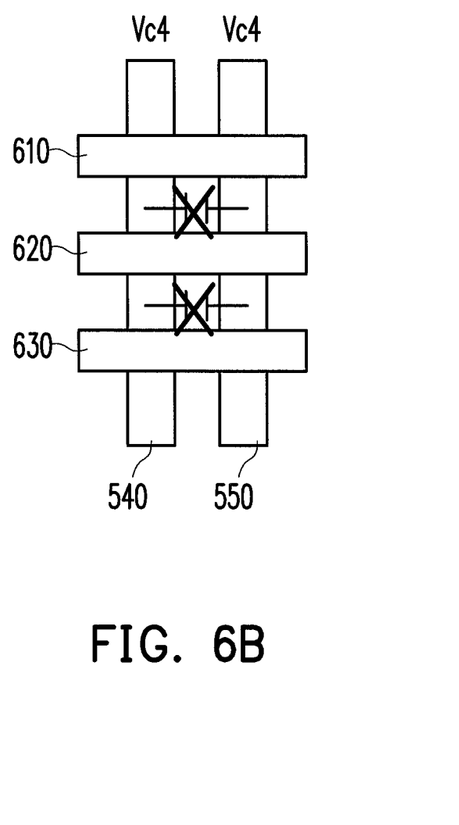

For example, FIG. 6A and FIG. 6B are layout schematic diagrams of diffusion bit lines and diffusion word lines according to an embodiment of the invention, in which the diffusion bit lines 540 and 550 and diffusion word lines 610-630 are illustrated. As shown in FIG. 6A, when the bit lines BL1 and BL2 are respectively biased at the ground voltage Vs4 and the power voltage Vc4, the two diffusion bit lines 540 and 550 are also biased at the ground voltage Vs4 and the power voltage Vc4. Now, a voltage difference between the bit lines BL1 and BL2 may cause the diffusion capacitance formed between the diffusion bit lines 540 and 550, so that the equivalent total capacitance Ctotal is increased. Comparatively, as shown in FIG. 6B, when the bit lines BL1 and BL2 are all biased at the power voltage Vc4, the two diffusion bit lines 540 and 550 are also biased at the power voltage Vc4. Now, since the voltage difference between the bit lines BL1 and BL2 is 0, the diffusion capacitance cannot be formed between the two diffusion bit lines 540 and 550, so that the equivalent total capacitance Ctotal is decreased.

In other words, during the process of programming the memory cells, regarding a certain bit line biased at the power voltage Vc4, if the two left and right adjacent bit lines thereof are all biased at the ground voltage Vs4, voltage differences are respectively formed between such bit line and the two left and right adjacent bit lines thereof, so that the equivalent total capacitance Ctotal is increased. However, in the present embodiment, regarding a certain bit line biased at the power voltage Vc4, at most one of the two left and right adjacent bit lines thereof is biased under the ground voltage Vs4, so that the equivalent total capacitance Ctotal can be reduced, and the channel voltage Vch can be accordingly increased. Moreover, in the present embodiment, during a process of increasing the channel voltage Vch, a level of the pass voltage Vt4 is not increased, so that increasing of the pass disturbance is avoided. In other words, the program disturbance of the memory cell is reduced while considering not to increase the pass disturbance.

It should be noticed that in the above embodiment, each of the page buffers 231-233 drives the N electrically connected bit lines one-by-one during the enabling period. Therefore, if the enabling period is divided into N sub-periods, during the $i^{th}$ sub-period, the $i^{th}$, $(i+N)^{th}$, $(i+2N)^{th}$, ..., $(i+(M-1)*N)^{th}$ bit lines are driven by the page buffers 231-233. In other words, according to another aspect, FIG. 7 is a programming method of a flash memory device according to another embodiment of the invention.

Figure 7:
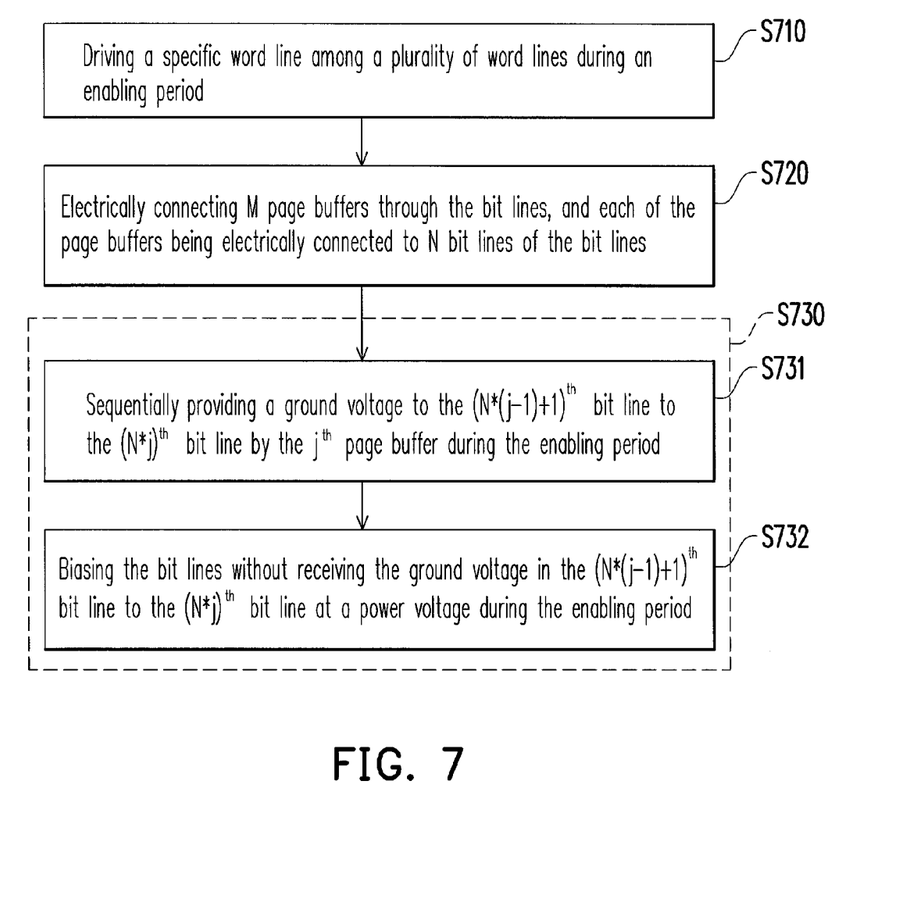
FIG. 7 is a programming method of a flash memory device according to another embodiment of the invention.

Referring to FIG. 2 and FIG. 7, during a process of programming the memory cell array 210, in step S710, the row decoder 220 drives a specific word line among the word lines during the enabling period. Detailed steps of the step S710 are the same or similar to that of the step S310 of FIG. 3, so that detailed descriptions thereof are not repeated. Moreover, in step S720, M page buffers 231-233 are electrically connected to the bit lines BL1-BL9, where each of the page buffers 231-233 is electrically connected to N bit lines, where M is a positive integer, and N is an integer greater than 2. In other words, a $j^{th}$ page buffer is electrically connected to an $((j-1)*N+1)^{th}$ bit line to an $(j*N)^{th}$ bit line, where j is an integer and $1 \leq j \leq M$.

Moreover, in step S730, during the enabling period, the $j^{th}$ page buffer sequentially drives the $(N*(j-1)+1)^{th}$ bit line to the $(N*j)^{th}$ bit line, so as to program the memory cells electrically connected to the specific word line one-by-one, where j is an integer and $1 \leq j \leq M$. For example, if M=3 and N=3, during the enabling period, the page buffer 231 provides the ground voltage Vs4 to the bit line BL1-BL3 one-by-one. Moreover, when the page buffer 231 provides the ground voltage Vs4 to the bit line BL1, the page buffer 231 biases the bit lines BL2 and BL3 at the power voltage Vc4. Similarly, when the page buffer 231 provides the ground voltage Vs4 to the bit line BL2, the page buffer 231 biases the bit lines BL1 and BL3 at the power voltage Vc4.

On the other hand, regarding the page buffer 232, during the enabling period, the page buffer 232 provides the ground voltage Vs4 to the bit line BL4-BL6 one-by-one. Moreover, when the page buffer 232 provides the ground voltage Vs4 to the bit line BL4, the page buffer 232 biases the bit lines BL5 and BL6 at the power voltage Vc4. Operations of the page buffer 233 are deduced by analogy. In other words, in steps S731 and S732, during the enabling period, the $j^{th}$ page buffer sequentially provides the ground voltage Vs4 to the $(N*(j-1)+1)^{th}$ bit line to the $(N*j)^{th}$ bit line, and the bit lines without receiving the ground voltage Vs4 in the $(N*(j-1)+1)^{th}$ bit line to the $(N*j)^{th}$ bit line are biased at the power voltage Vc4. The above embodiments can be referred for detailed descriptions of the present embodiment, which are not repeated herein.

In summary, each of the page buffers is electrically connected to three or more than three bit lines, and each of the page buffers drives the electrically connected bit lines during the enabling period one-by-one. In this way, the equivalent total capacitance of the memory cell strings can be reduced, so as to increase a channel voltage of each of the memory cell strings. Moreover, during the process of increasing the channel voltage, a level of the pass voltage is not increased, so that the pass disturbance is not increased. In other words, according to the invention, the program disturbance of the memory cell is reduced while considering not to increase the pass disturbance.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A flash memory device, comprising:
a memory cell array, comprising a plurality of memory cells, and electrically connected to a plurality of word lines and a plurality of bit lines;
a row decoder, for driving a specific word line among the word lines during an enabling period;
a first page buffer, for sequentially driving a first to an $N^{th}$ bit lines among the bit lines during the enabling period, so as to program the memory cells electrically connected to the specific word line and the first page buffer, wherein N is an integer equal to or greater than 3; and
a second page buffer, for sequentially driving an $(N+1)^{th}$ to a $(2*N)^{th}$ bit lines among the bit lines during the enabling period, so as to program the memory cells electrically connected to the specific word line and the second page buffer,
wherein one of an $(i-1)^{th}$ bit line and an $(i+1)^{th}$ bit line is not driven when an $i^{th}$ bit line is not driven, and i is an integer and $1 < i < 2*N$.

2. The flash memory device as claimed in claim 1, wherein the memory cell array is further electrically connected to a string selection line and a ground selection line, and the row decoder respectively provides a power voltage and a ground voltage to the string selection line and the ground selection line during the enabling period, provides a program voltage to the specific word line, and provides a pass voltage to the other word lines.

3. The flash memory device as claimed in claim 1, wherein the first page buffer provides a ground voltage to the first to the $N^{th}$ bit lines sequentially during the enabling period, the second page buffer provides the ground voltage to the $(N+1)^{th}$ to the $(2*N)^{th}$ bit lines sequentially during the enabling period, and when the $i^{th}$ bit line is not driven, the $i^{th}$ bit line is biased at a power voltage and one of the $(i-1)^{th}$ bit line and the $(i+1)^{th}$ bit line is also biased at the power voltage.

4. The flash memory device as claimed in claim 1, wherein the memory cell array is an NAND memory cell array.

5. A programming method of a flash memory device, wherein the flash memory device comprises a memory cell array electrically connected to a plurality of word lines and a plurality of bit lines, and the memory cell array comprises a plurality of memory cells, the programming method of the flash memory device comprising:
driving a specific word line among the word lines during an enabling period;
sequentially driving a first to an $N^{th}$ bit lines among the bit lines through a first page buffer during the enabling period, so as to program the memory cells electrically connected to the specific word line and the first page buffer, wherein N is an integer equal to or greater than 3; and sequentially driving an $(N+1)^{th}$ to a $(2*N)^{th}$ bit lines among the bit lines through a second page buffer during the enabling period, so as to program the memory cells electrically connected to the specific word line and the second page buffer, wherein one of an $(i-1)^{th}$ bit line and an $(i+1)^{th}$ bit line is not driven when an $i^{th}$ bit line is not driven, and i is an integer and $1<i<2*N$.

6. The programming method of the flash memory device as claimed in claim 5, wherein the memory cell array is further electrically connected to a string selection line and a ground selection line, and the step of driving the specific word line among the word lines during the enabling period comprises:
providing a power voltage to the string selection line;
providing a ground voltage to the ground selection line;
providing a program voltage to the specific word line; and
providing a pass voltage to the other word lines.

7. The programming method of the flash memory device as claimed in claim 5, wherein
the first page buffer provides a ground voltage to the first to the $N^{th}$ bit lines sequentially during the enabling period, the second page buffer provides the ground voltage to the $(N+1)^{th}$ to the $(2*N)^{th}$ bit lines sequentially during the enabling period, and when the $i^{th}$ bit line is not driven, the $i^{th}$ bit line is biased at a power voltage and one of the $(i-1)^{th}$ bit line and the $(i+1)^{th}$ bit line is also biased at the power voltage.

8. The programming method of the flash memory device as claimed in claim 5, wherein the memory cell array is an NAND memory cell array.

* * * * *